(12) United States Patent
Lin et al.

(10) Patent No.: US 12,305,682 B2
(45) Date of Patent: May 20, 2025

(54) LOCKING DEVICE AND FUNCTIONAL MODULE

(71) Applicant: Fulian Precision Electronics (Tianjin) Co., LTD., Tianjin (CN)

(72) Inventors: Jia-Feng Lin, New Taipei (TW); Chieh-Hsiang Lin, New Taipei (TW)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 514 days.

(21) Appl. No.: 17/731,390

(22) Filed: Apr. 28, 2022

(65) Prior Publication Data
US 2022/0356890 A1 Nov. 10, 2022

(30) Foreign Application Priority Data
May 8, 2021 (CN) .......................... 202110501048.0

(51) Int. Cl.
| | |
|---|---|
| *F16B 2/18* | (2006.01) |
| *F16B 2/10* | (2006.01) |
| *F16B 2/12* | (2006.01) |
| *H05K 5/02* | (2006.01) |
| *H05K 7/14* | (2006.01) |

(52) U.S. Cl.
CPC .................. *F16B 2/12* (2013.01); *F16B 2/10* (2013.01); *F16B 2/185* (2013.01); *H05K 5/0221* (2013.01); *H05K 7/1401* (2013.01); *H05K 7/1418* (2013.01)

(58) Field of Classification Search
CPC ...... F16B 2/185; H05K 7/1401; H05K 5/0221
See application file for complete search history.

(56) References Cited

U.S. PATENT DOCUMENTS

| | | | | | |
|---|---|---|---|---|---|
| 4,580,192 | A | * | 4/1986 | Beun .................... | H05K 7/1405 439/352 |
| 7,284,997 | B2 | * | 10/2007 | Joist .................... | H05K 7/1409 439/157 |
| 8,385,076 | B2 | * | 2/2013 | Peng .................... | H05K 7/1401 361/740 |
| 8,641,313 | B1 | * | 2/2014 | Crippen ............... | H05K 5/0221 403/322.1 |
| 11,441,329 | B2 | * | 9/2022 | Tseng .................... | E05B 13/10 |
| 2016/0120056 | A1 | * | 4/2016 | Kuang .................... | E05C 3/042 403/322.4 |
| 2017/0042054 | A1 | * | 2/2017 | Su ........................ | H05K 7/1409 |
| 2019/0373752 | A1 | * | 12/2019 | Joko .................... | H05K 7/1487 |

* cited by examiner

*Primary Examiner* — Michael P Ferguson
(74) *Attorney, Agent, or Firm* — ScienBiziP, P.C.

(57) ABSTRACT

A locking device and a functional module including the locking device are provided. The locking device includes a mounting frame with a latching column, and a locking assembly locking or releasing the mounting frame. The locking assembly includes a main body pivotally connected with the mounting frame, a latch rotatably connected with the main body, and a sliding cover slidably mounted on the main body and can drive the latch to rotate relative to the main body. When the latch is engaged with the latching column, the locking assembly is locked to the mounting frame. When the sliding cover is moved relative to the main body, the latch rotates relative to the main body to disengage from the latching column. The latch does not need to be rotated separately, and unlocking efficiency of the locking device is improved.

12 Claims, 5 Drawing Sheets

LOCKING DEVICE AND FUNCTIONAL MODULE

FIELD

The subject matter herein generally relates to data storage devices, in particular to a locking device and a functional module including the locking device.

BACKGROUND

In a server, a flexible latching block on a hard disk carrier engages with a latching groove on a server chassis to fix the hard disk carrier to the server chassis. Such latching block is first pushed and then pulled to be disengaged from the latching groove. When a lateral space of such latching block is too small, disengaging the latching block from the latching groove is difficult.

BRIEF DESCRIPTION OF THE DRAWINGS

Implementations of the present technology will now be described, by way of embodiment, with reference to the attached figures.

DETAILED DESCRIPTION

The technical solutions in the embodiments of the present disclosure are clearly and completely described in the following with reference to the accompanying drawings in the embodiments of the present disclosure. The described embodiments are only some of the embodiments of the present disclosure, and not all of the embodiments. All other embodiments obtained by those skilled in the art based on the embodiments of the present disclosure without creative efforts are within the scope of the present disclosure.

Unless otherwise defined, all technical and scientific terms used herein have the same meaning as those understood in the art. The terminology used in the description of the present disclosure is for the purpose of describing particular embodiments and is not intended to limit the disclosure.

Embodiments of the present disclosure provide a locking device and a functional module including the locking device. The locking device includes a mounting frame with a latching column, and a locking assembly configured to lock or release the mounting frame. The locking assembly includes a main body, a latch, and a sliding cover. The main body is pivotally connected with the mounting frame. The latch is rotatably connected with the main body. The sliding cover is slidably installed on the main body and can drive the latch to rotate relative to the main body. The latch is engaged with the latching column when the locking assembly is locked to the mounting frame. When the sliding cover is moved relative to the main body, the latch rotates relative to the main body to disengage from the latching column.

The sliding cover is moved to rotate the main body, so as to separate the latch from the latching column and allow separation of the locking assembly from the mounting frame. The latch does not need to be rotated separately. Thus, the separation process of the locking assembly and the mounting frame is simplified, and unlocking efficiency of the locking device of the functional module is improved.

Figure 1:
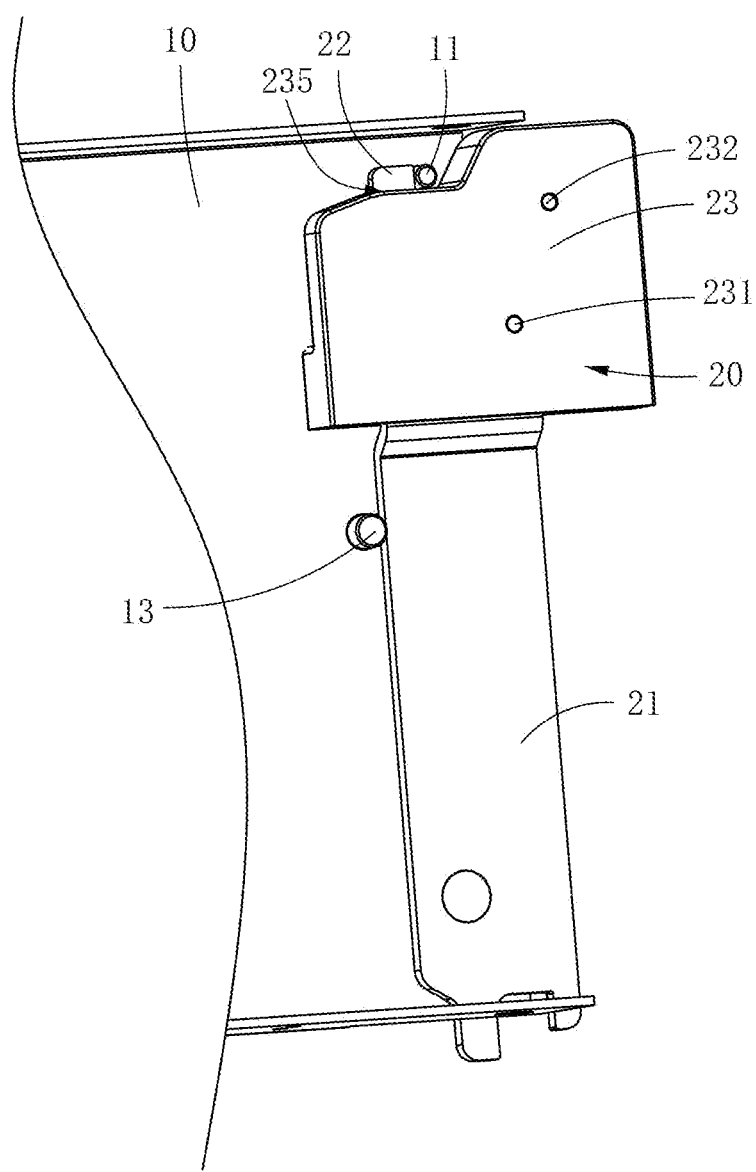
FIG. 1 is a perspective view of a locking device for a functional module according to an embodiment of the present disclosure.
Figure 5:
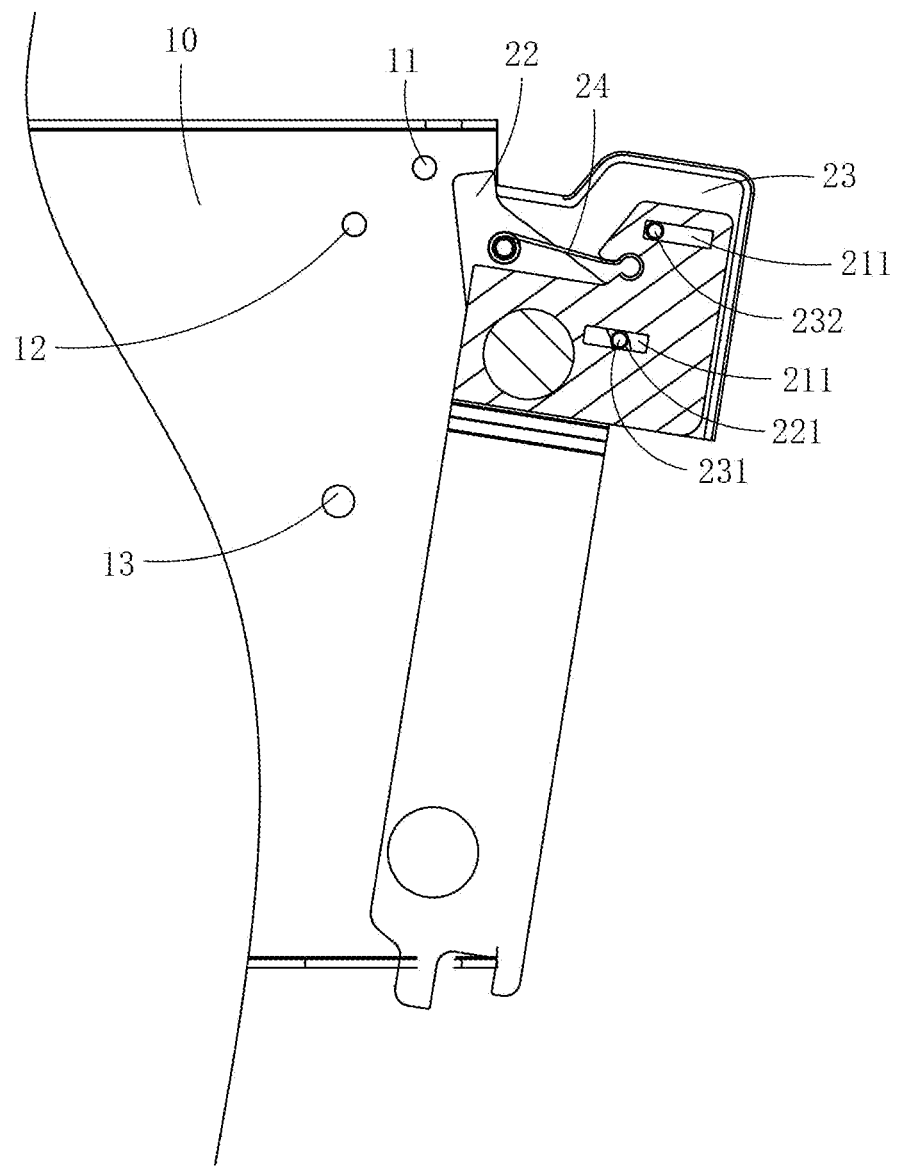
FIG. 5 is a schematic view showing the latch disengaged from the latching column in the interior of the sliding cover of the locking device according to an embodiment of the present disclosure.

Referring to FIGS. 1 and 5, an embodiment of a locking device 100 for a functional module is provided. The locking device 100 includes a mounting frame 10 and a locking assembly 20. The locking assembly 20 is connected with the mounting frame 10 and is capable of engaging with or disengaging from the mounting frame 10. The functional module is a module having one or more functions in an electronic device, such as data storage function or data processing function. Without limitation, the functional module may include an electronic device, such as hard disk, motherboard, memory card, network card, or server host.

The mounting frame 10 is provided with a latching column 11, a first stop column 12, and a second stop column 13. The first stop column 12 and the second stop column 13 are arranged at intervals and are horizontally staggered. The latching column 11 is configured to engage with the locking assembly 20, so that the locking assembly 20 is locked to the mounting frame 10.

The second stop column 13 protrudes towards a main body 21 of the locking assembly 20 and is on the same side as the first stop column 12. The second stop column 13 is configured to abut against the main body 21 to limit a movement of the main body 21.

Figure 2:
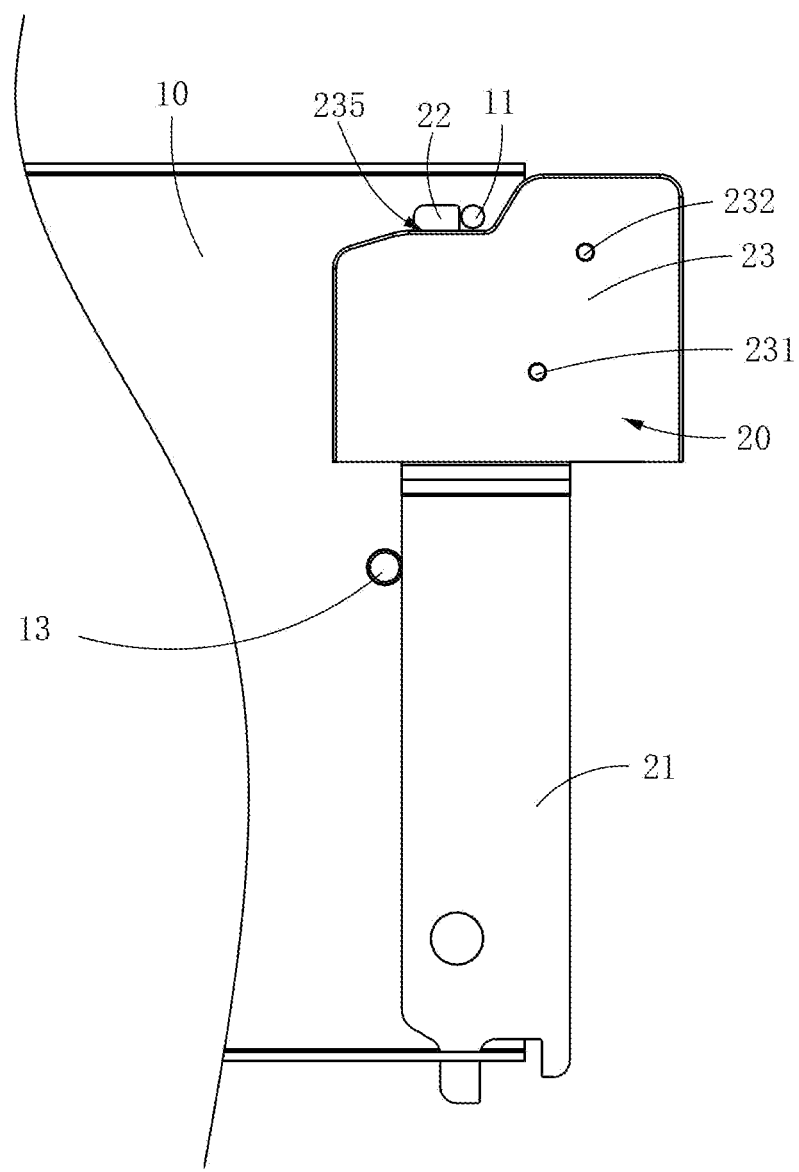
FIG. 2 is a front view of the locking device of FIG. 1.
Figure 3:
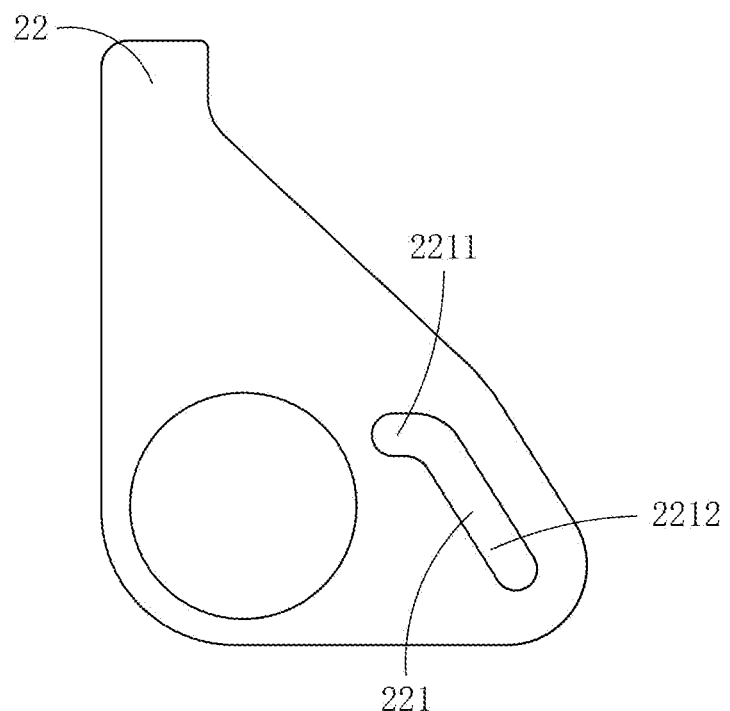
FIG. 3 is a schematic view of a latch of the locking device of FIG. 1.

Referring to FIGS. 1 to 3, the locking assembly 20 includes the main body 21, a latch 22, and a sliding cover 23. The latch 22 is rotatably connected with the main body 21. The sliding cover 23 is slidably installed on the main body 21 and can rotate the latch 22 relative to the main body 21 to engage or disengage the latch 22 with or from the latching column 11. The latch 22 is engaged with the latching column 11 when the locking assembly 20 is locked to the mounting frame 10. When the sliding cover 23 is moved relative to the main body 21, the latch 22 rotates relative to the main body 21 and is disengaged from the latching column 11.

The sliding cover 23 is moved to rotate the latch 22 relative to the main body 21, so as to separate the latch 22 from the latching column 11 and allow separation of the locking assembly 20 from the mounting frame 10. There is no need to rotate the latch 22 separately. Thus, the separation process of the locking assembly 20 and the mounting frame 10 is simplified and unlocking efficiency of the locking device 100 of the functional module is improved.

The latch 22 is pivotally connected with the main body 21. A rail slot 221 is defined on the latch 22. A first movable column 231 is disposed on the sliding cover 23. In one embodiment, the sliding cover 23 is hollow, and the first movable column 231 is accommodated in the sliding cover 23. The first movable column 231 extends through the main body 21 and is inserted into the rail slot 221. The first movable column 231 is movably disposed through the main body 21. The first movable column 231 can abut against different heights of the rail slot 221 to rotate the latch 22 relative to the main body 21. When the first movable column 231 is abutted against different heights of the rail slot 221, the latch 22 is driven to rotate relative to the main body 21, thus the latch 22 is engaged with or disengaged from the latching column 11.

Through the arrangement of the first movable column 231 inserted into the rail slot 221, the sliding cover 23 can be moved to drive the latch 22 to rotate relative to the main body 21. Thus, there is no need to rotate the latch 22 separately.

A second movable column 232 is disposed on the sliding cover 23. The second movable column 232 is spaced from the first movable column 231. The main body 21 defines two guiding slots 211 (shown in FIG. 4) for the first movable column 231 and the second movable column 232 to pass through. The two guiding slots 211 are configured to guide the movements of the first movable column 231 and the second movable column 232. Each of the guiding slots 211 extends along a length direction of the main body 21.

The guiding slots 211 guide the first movable column 231 and the second movable column 232, aiding smooth movement of the first movable column 231 and the second movable column 232, and ensuring that the first movable column 231 abuts against the rail slot 221. In addition, the horizontal movement of the first movable column 231 and the second movable column 232 is realized by the guiding slots 211. Thus, the rotation of the latch 22 relative to the main body 21 is achieved.

The rail slot 221 communicates with the guiding slot 211 in a thickness direction of the latch 22. The first movable column 231 extends through the rail slot 221 and the guiding slot 211. The rail slot 221 is inclined with respect to the guiding slot 211. The arrangement of the inclined rail slot 221 allows the first movable column 231 to slide along the guiding slot 211 to abut against different heights of the rail slot 221, thereby driving the latch 22 to rotate relative to the main body 21, thus the latch 22 is engaged with or disengaged from the latching column 11.

The latch 22 is elastically connected with the main body 21. Alternatively, a spring 24 is disposed between the latch 22 and the main body 21, and opposite ends of the spring 24 connect with the latch 22 and the main body 21. The latch 22 can rotate relative to the main body 21 or can return to its original position by the force of the spring 24.

The rail slot 221 includes a first slot portion 2211 and a second slot portion 2212 intercommunicating with each other. The second slot portion 2212 is inclined with respect to the first slot portion 2211. The first slot portion 2211 faces and is aligned with one of the guiding slots 211. Alternatively, the first slot portion 2211 is arranged horizontally. When the first movable column 231 is in the first slot portion 2211, the latch 22 is engaged with the latching column 11, thus providing self-locking of the latch 22, and avoiding looseness the latch 22 in other directions. Alternatively, when the main body 21 is restricted by the second stop column 13, the sliding cover 23 can slide relative to the main body 21, so that the first movable column 231 can move to the first slot portion 2211 to realize the self-locking of the latch 22.

In addition, when the first stop column 12 abuts against a side of the latch 22 away from the latching column 11, the latch 22 can be driven to rotate relative to the main body 21. When the second stop column 13 abuts against the main body 21, the first movable column 231 can move relative to the main body 21, moving to the first slot portion 2211 to realize the self-locking of the latch 22.

Alternatively, the latch 22 is accommodated in the sliding cover 23. The sliding cover 23 defines an opening 235. The latch 22 extends out of the opening 235 and is engaged with the latching column 11.

The main body 21 is pivotally connected with the mounting frame 10. The main body 21 can rotate relative to the mounting frame 10. The sliding cover 23 can be moved by a user, and the sliding cover 23 drives the latch 22 to rotate relative to the main body 21. When the first movable column 231 abuts against an end of one of the guiding slots 211, the sliding cover 23 drives the main body 21 to move, so that the main body 21 is rotated relative to the mounting frame 10. The main body 21 being pivotally connected with the mounting frame 10 allows the main body 21 to rotate relative to the mounting frame 10.

Figure 4:
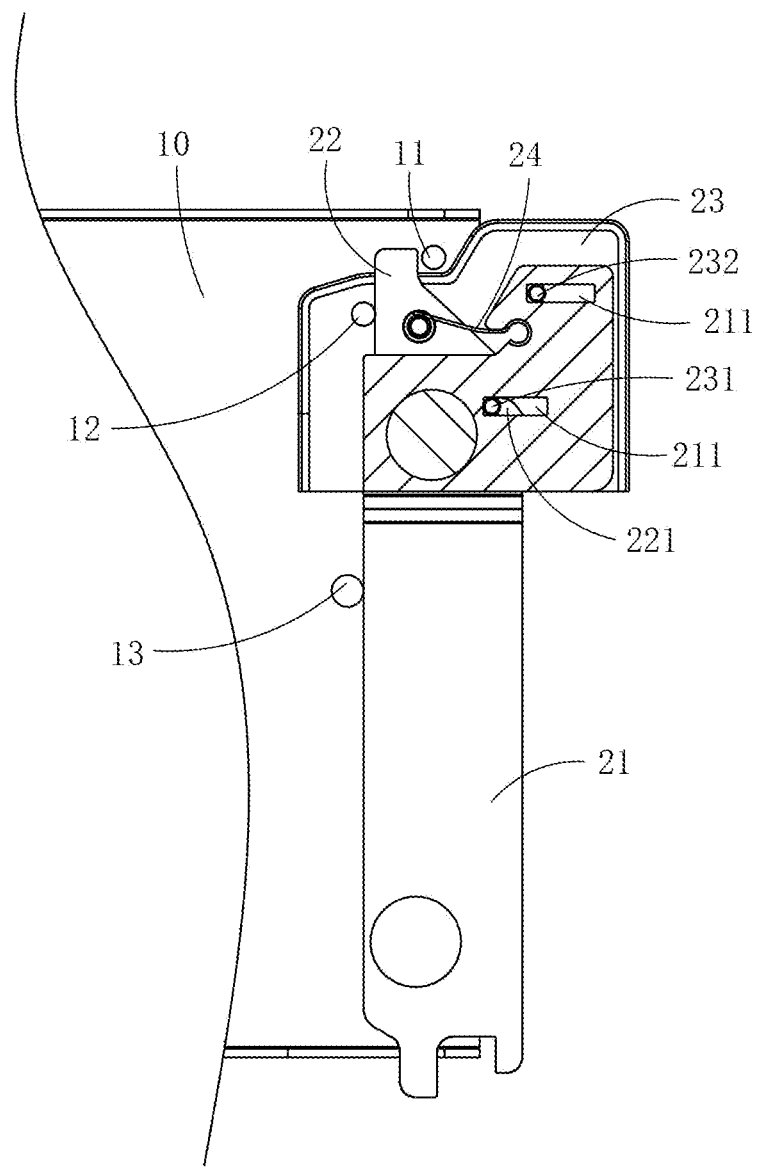
FIG. 4 is a schematic view showing the latch engaged with a latching column in an interior of a sliding cover of the locking device according to an embodiment of the present disclosure.

Referring to FIGS. 4 and 5, a flow of actions of the locking device 100 is as follows:

When the locking assembly 20 is locked to the mounting frame 10, the latch 22 is engaged with the latching column 11. When the user pulls the sliding cover 23 horizontally, the sliding cover 23 moves, and the main body 21 is separated from the second stop column 13. The first movable column 231 moves along the guiding slot 211 and the rail slot 221 to rotate the latch 22 relative to the main body 21. At this time, the latch 22 is disengaged from the latching column 11. After the first movable column 231 is moved to an end of the guiding slot 211, the movement of the first movable column 231 rotates the main body 21 relative to the mounting frame 10, and the latch 22 is reset towards the main body 21 through the action of the spring 24.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:
1. A locking device comprising:
a mounting frame with a latching column; and
a locking assembly configured to lock or release the mounting frame, the locking assembly comprising:
a main body pivotally connected with the mounting frame;
a latch rotatably connected with the main body; and
a sliding cover slidably mounted on the main body and configured to drive the latch to rotate relative to the main body,
wherein the latch defines a rail slot, the main body defines at least one guiding slot, the rail slot communicates with the at least one guiding slot in a thickness direction of the latch, the rail slot is inclined with respect to the at least one guiding slot, a first movable column is disposed on the sliding cover, the first movable column is inserted into the rail slot and the at least one guiding slot, a first stop column is disposed on the mounting frame, the first stop column and the latching column are staggered, and the first stop column is configured to abut against a side of the latch away from the latching column to drive the latch to rotate relative to the main body;
wherein when the latch is engaged with the latching column, the locking assembly is locked to the mounting frame,
wherein when the first stop column abuts against the side of the latch away from the latching column and the sliding cover is moved relative to the main body, the first movable column moves along the at least one guiding slot and the rail slot, and the first movable column abuts against different heights of the rail slot and rotates the latch relative to the main body, such that the latch is disengaged from the latching column.

2. The locking device of claim 1, wherein a second movable column is disposed on the sliding cover, the second movable column and the first movable column are spaced from each other, the main body defines two guiding slots for the first movable column and the second movable column to pass through respectively, the two guiding slots are configured to guide the first movable column and the second movable column, and the rail slot communicates with one of the two guiding slots.

3. The locking device of claim 2, wherein the rail slot comprises a first slot portion and a second slot portion intercommunicating with each other, the second slot portion is inclined relative to the first slot portion, the first slot portion is aligned with the one of the two guiding slots.

4. The locking device of claim 3, wherein a second stop column is disposed on the mounting frame, the second stop column protrudes towards the main body and is on a same side as the first stop column, the second stop column is configured to abut against the main body to drive the first movable column to move relative to the main body until the first movable column is moved to the first slot portion.

5. The locking device of claim 1, wherein the latch is elastically connected with the main body.

6. The locking device of claim 1, wherein the latch is accommodated in the sliding cover, the sliding cover defines an opening, and the latch extends out of the opening.

7. A functional module comprising a locking device, wherein the locking device comprises:
 a mounting frame with a latching column; and
 a locking assembly configured to lock or release the mounting frame, the locking assembly comprises:
  a main body pivotally connected with the mounting frame;
  a latch rotatably connected with the main body; and
  a sliding cover slidably mounted on the main body and configured to drive the latch to rotate relative to the main body,
 wherein the latch defines a rail slot, the main body defines at least one guiding slot, the rail slot communicates with the at least one guiding slot in a thickness direction of the latch, the rail slot is inclined with respect to the at least one guiding slot, a first movable column is disposed on the sliding cover, the first movable column is inserted into the rail slot and the at least one guiding slot a first stop column is disposed on the mounting frame, the first stop column and the latching column are staggered, and the first stop column is configured to abut against a side of the latch away from the latching column to drive the latch to rotate relative to the main body;
 wherein when the latch is engaged with the latching column, the locking assembly is locked to the mounting frame,
 wherein when the first stop column abuts against the side of the latch away from the latching column and the sliding cover is moved relative to the main body, the first movable column moves along the at least one guiding slot and the rail slot to rotate the latch relative to the main body, such that the latch is disengaged from the latching column.

8. The functional module of claim 7, wherein a second movable column is disposed on the sliding cover, the second movable column and the first movable column are spaced from each other, the main body defines two guiding slots for the first movable column and the second movable column to pass through respectively, the two guiding slots are configured to guide the first movable column and the second movable column, and the rail slot communicates with one of the two guiding slots.

9. The functional module of claim 8, wherein the rail slot comprises a first slot portion and a second slot portion intercommunicating with each other, the second slot portion is inclined relative to the first slot portion, the first slot portion is aligned with the one of the two guiding slots.

10. The functional module of claim 9, wherein a second stop column is disposed on the mounting frame, the second stop column protrudes towards the main body and is on a same side as the first stop column, the second stop column is configured to abut against the main body to drive the first movable column to move relative to the main body until the first movable column is moved to the first slot portion.

11. The functional module of claim 7, wherein the latch is elastically connected with the main body.

12. The functional module of claim 7, wherein the latch is accommodated in the sliding cover, the sliding cover defines an opening, and the latch extends out of the opening.

* * * * *